United States Patent [19]

Sueyoshi et al.

[11] 4,150,339
[45] Apr. 17, 1979

[54] TEMPERATURE INSENSITIVE DC VOLTAGE DETECTION AND PROTECTION CIRCUIT

[75] Inventors: Susumu Sueyoshi; Hideo Ito, both of Tokyo, Japan

[73] Assignee: Pioneer Electronic Corporation, Tokyo, Japan

[21] Appl. No.: 880,816

[22] Filed: Feb. 24, 1978

[30] Foreign Application Priority Data

Feb. 28, 1977 [JP] Japan .................. 52-21127

[51] Int. Cl.² ........................................... H03F 3/183
[52] U.S. Cl. .................................. 330/298; 307/360; 330/257
[58] Field of Search .............. 330/207 P, 257, 298; 307/360; 179/1 A

[56] References Cited

U.S. PATENT DOCUMENTS

| 3,987,368 | 10/1976 | Ahmed | 330/257 |
| 4,030,012 | 6/1977 | Buhler | 330/207 P X |
| 4,034,268 | 7/1977 | Klauck | 330/207 P X |

FOREIGN PATENT DOCUMENTS 463139  1/1971  Japan ........................ 307/360

Primary Examiner—James B. Mullins
Attorney, Agent, or Firm—Sughrue, Rothwell, Mion, Zinn and Macpeak

[57] ABSTRACT

A circuit for detecting a DC signal in the output of an audio amplifier 1 and for uncoupling a speaker SP in response thereto comprises a low-pass filter 2 whose output is coupled to one input of differential amplifiers 5, 6 whose other inputs are unbalanced by respective positive and negative threshold biasing potentials $E_1$, $E_2$. The differential amplifiers are directly connected to respective current mirror circuits 7, 8, and their high impedance side collector outputs are applied to the inputs of an OR circuit whose output in turn controls the speaker uncoupling.

7 Claims, 5 Drawing Figures

TEMPERATURE INSENSITIVE DC VOLTAGE DETECTION AND PROTECTION CIRCUIT

BACKGROUND OF THE INVENTION

This invention relates to a temperature and supply voltage insensitive DC voltage detection circuit for the protection of audio speakers or the like.

A conventional DC amplifier such as an output capacitorless (OCL) amplifier employs negative and positive DC power supplies, and the potential at the output terminal thereof to which a load such as a loudspeaker is connected must be maintained at a zero DC voltage level. However, the output of the DC amplifier sometimes includes a DC voltage component because of variations in bias voltage or the like caused by variations in temperature or fluctuations in the supply voltage. The occurrence of such a DC voltage adversely affects the loudspeaker load, and therefore a protection circuit has been proposed which detects the presence of a DC output voltage and disconnects the load from the amplifier in response thereto.

Such a conventional circuit is shown in FIG. 1, wherein a DC amplifier 1 receives an audio signal through input terminal 1a. The output terminal 1b of the amplifier is connected to a loudspeaker SP through a relay switch $L_1$, to a low pass filter 2 consisting of resistors R1, R2 and a capacitor C1, and through the filter 2 to a differential amplifier circuit 3 adapted to detect positive and negative DC voltages. The differential amplifier circuit 3 comprises transistors Q1 and Q2, biasing resistors R3 and R4, load resistors R5 and R6, a constant current source $I_1$ connected to the common emitters of Q1 and Q2, and diodes D1 and D2 whose cathodes are connected to the collectors of Q1 and Q2 to form an OR circuit. The anodes of D1 and D2 are connected together to the base of a transistor Q3 in a relay driving circuit 4. A relay winding L is connected to the collector of Q3, and maintains the spring loaded switch $L_1$ closed when energized.

In operation, when a DC voltage is developed at the output terminal 1b of the DC amplifier 1, a direct current is applied to the base of Q1 through the low pass filter 2. The differential input voltage-output voltage variation characteristic of the differential amplifier circuit 3 is shown in FIG. 2. When no DC input voltage is applied through the low pass filter 2, the potential difference between the bases of Q1 and Q2 is zero. The collector potentials of these transistors are thus maintained equal, as indicated by point A in FIG. 2. When a DC voltage is applied through the low pass filter 2, however, the potentials at the collectors of Q1 and Q2 vary in a complementary manner as shown. When the potential at one of collectors reaches point B or C, one of the diodes D1 or D2 is rendered conductive, as a result of which Q3 turns off to deenergize the relay winding L and open switch $L_1$ to disconnect the loudspeaker SP from the DC amplifier 1.

The operating characteristics of the differential amplifier 3 vary with temperature, however, as indicated in FIG. 2. For example, as the ambient or immediately adjacent temperature changes, the operating characteristics pinch in with steeper slopes, as shown by the dotted lines in FIG. 2. Under these conditions, upon the application of a small but acceptable or tolerable DC voltage through the low pass filter, the collector potential of Q1 or Q2 quickly reaches point B or C, as a result of which one of the diodes D1 and D2 is rendered conductive and the relay winding L is deenergized. Thus, with such a prior art differential amplifier the sensitively undesirably varies or fluctuates in accordance with even minor temperature changes.

SUMMARY OF THE INVENTION

Accordingly, an object of this invention is to eliminate the above-described difficulties accompanying the conventional circuit by providing a DC voltage detection and protective circuit whose sensitivity is immune to temperature variations.

More specifically, a circuit for detecting a DC signal in the output of an audio amplifier and for uncoupling a speaker in response thereto comprises a low-pass filter whose output is separately coupled to one input of two differential amplifiers whose other inputs are unbalanced by respective positive and negative threshold biasing potentials $E_1$, $E_2$. The differential amplifiers are directly connected to respective current mirror circuits, and their high impedance side collector outputs are applied to the inputs of an OR circuit whose output in turn controls the speaker uncoupling.

DETAILED DESCRIPTION OF THE PREFERRED EMBODIMENT

Figure 3:
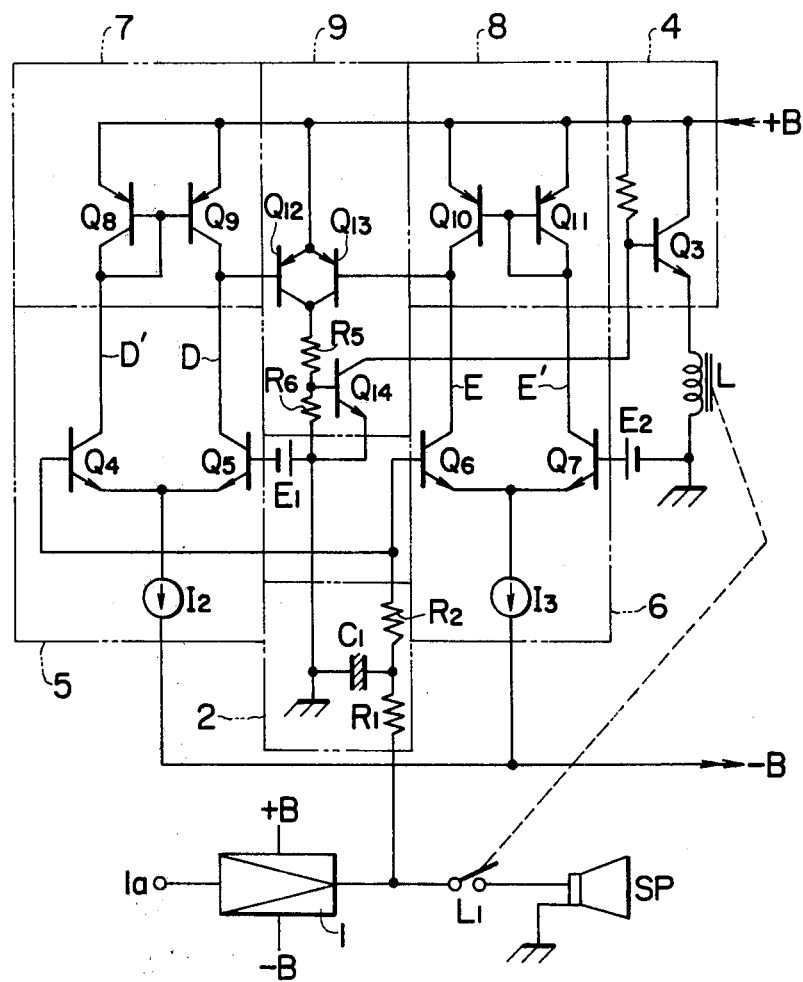
FIG. 3 shows a DC voltage detection and protection circuit according to this invention.

A preferred embodiment of the invention will be now described in detail with reference to FIGS. 3 and 4.

Figure 1:
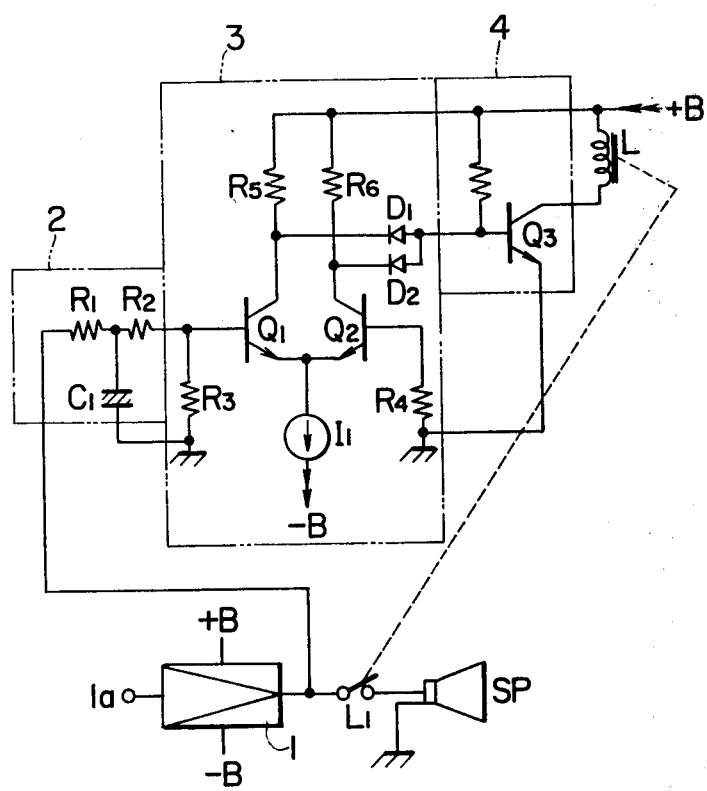
FIG. 1 shows a schematic diagram of a conventional DC voltage detection circuit.
Figure 2:
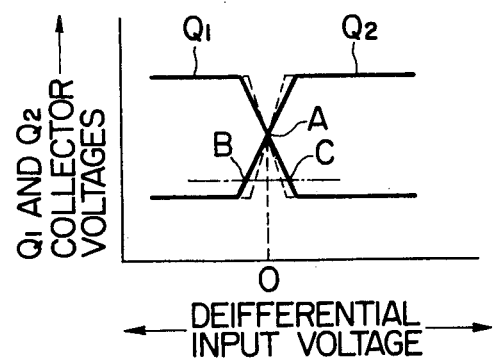
FIG. 2 shows a plot of characteristic operating curves for the circuit of FIG. 1.

The description of the components identical with those shown in FIG. 1 has been omitted for the sake of simplicity. The output of the low pass filter 2 is applied to a first differential amplifier 5 comprising transistors Q4 and Q5 whose common emitters are coupled to a constant current source $I_2$, and to a second differential amplifier 6 comprising transistors Q6 and Q7 whose common emitters are coupled to a constant current source $I_3$. The base of Q5 is connected to a negative bias source E1, while the base of Q7 is connected to a positive bias source E2. The collectors of the transistors in the first differential amplifier 5 are connected to an active load comprising a first current mirror circuit 7 consisting of transistors Q8 and Q9, while the collectors of the transistors in the second differential amplifier 6 are connected to an active load comprising a second current mirror circuit 8 consisting of transistors Q10 and Q11. The collectors of Q9 and Q5, and the collectors of Q10 and Q6, that is the high impedance output sides of the active loads, are respectively connected to the bases of transistors Q12 and Q13 which form a control voltage generating circuit 9. The latter comprises Q12 and Q13 whose emitters and collectors are connected together, series resistors R5 and R6, and an output transistor Q14. When no DC voltage is present in the output of the DC amplifier 1, Q12 and Q13 are rendered non-conductive, and therefore no voltage is developed across R5 and R6. When a DC voltage appears at the output of the DC amplifier, however, either Q12 or Q13 is rendered conductive according to the polarity of such voltage, as a result of which Q14 is rendered conductive to thereby cutoff Q3 and deenergize the relay winding L. That is, Q12 and Q13 in the control voltage generating circuit 9 form an OR circuit with respect to the outputs of the first and second current mirror circuits.

Figure 4A:
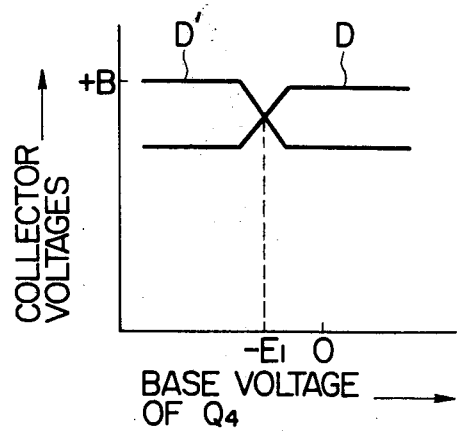
FIGS. 4(a) and 4(b) show plots of characteristic operating curves for the circuit of FIG. 3.

The complete operation of the circuitry of FIG. 3 will now be described. In general, when no DC voltage is present at the output of the low-pass filter 2, Q5 is off while Q4 is on because of the negative bias source E1 connected to the base of Q5. Similarly, Q8 is on while Q9 is also on in the first current mirror circuit 7. Due to the positive bias source E2 connected to the base of Q7 in the second differential amplifier 6, Q7 is on while Q6 is off, and Q11 in the second current mirror circuit 8 is on while Q10 is also on. FIG. 4(a) shows the collector potential characteristics of Q4, Q8 (D') and Q5, Q9 (D) with respect to the base voltage of Q4 in the first differential amplifier 5. When a sufficiently negative DC voltage appears at the output of the low-pass filter 2 so that the base voltage of Q4 becomes lower than −E1, Q5 is rendered conductive and its collector potential D maintains a value fixed by the base-emitter voltage $V_{BE}$ of Q12, which is also rendered conductive. On the other hand, the collector potential D' gradually increases and approaches the +B supply voltage as Q4 is rendered non-conductive.

Figure 4B:
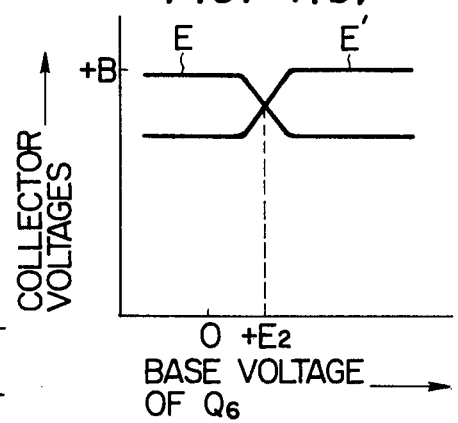

FIG. 4(b) shows the collector potential characteristics of Q6, Q10 (E) and Q7, Q11 (E') with respect to the base voltage of Q6 in the second differential amplifier 6. The characteristics shown in FIG. 4(b) are similar to those of FIG. 4 (a). In this case, when the low-pass filter 2 provides a positive DC voltage and the base of Q6 becomes higher than +E2, Q6 is rendered conductive and Q13 is also rendered conductive. Even if a higher positive DC voltage is applied to Q6 the collector potential E cannot exceed a maximum value because it is limited by the base-emitter voltage $V_{BE}$ of Q13. As a result Q13 is rendered conductive, current flows through R5 and R6, Q14 is rendered conductive, and Q3 in the relay driving circuit 4 is rendered non-conductive to thereby deenergize the relay winding L.

As described above, since the first and second differential amplifiers 5 and 6 are connected to the active loads of their respective current mirror circuits 7 and 8 their gains are high, and one of the differential amplifiers inverts its state when the base voltage of Q4 or Q6 exceeds −E1 or +E2, respectively, as seen from FIGS. 4(a) and 4(b). Thus, the positive and negative threshold voltages at which protection operation is effected with respect to any DC voltage appearing in the output of the power amplifier 1 can be selected as desired by suitably setting the values of the positive and negative biasing sources E1 and E2.

As is apparent from the above description, positive and negative DC voltages are detected substantially at the intersection of the input base voltage vs collector output characteristic curves of the differential amplifier. Therefore, variations in DC detection sensitivity, which is the main drawback accompanying the conventional circuit, are effectively eliminated. It is also possible to obtain a constant DC voltage detection sensitivity from the value of the bias source for either one of the two differential amplifiers, independent of temperature.

Furthermore, as the bases and emitters of matched transistors Q12 and Q13 are connected between the collectors and emitters of Q9 and Q10 in the first and second current mirror circuits, even if a positive or negative DC voltage appears at the amplifier output to thereby invert the conductive state of the first or second differential amplifier, the transistor on the "on" side is never saturated and the input impedance on the "on" side is not reduced. Accordingly, even if a DC voltage close to the threshold value is applied, a stable DC voltage detection and protection operation is still obtained.

What is claimed is:

1. A temperature insensitive circuit for detecting the presence of a DC component in an audio amplifier output, comprising:
   (a) a low-pass filter having its input connected to the amplifier output,
   (b) a pair of differential amplifiers,
   (c) means individually connecting the filter output to one input of each differential amplifier,
   (d) positive and negative bias voltage sources individually connected to the other inputs of the differential amplifiers,
   (e) a pair of current mirror circuits individually connected as active loads to the outputs of the differential amplifiers, each current mirror circuit having a high impedance output side, and
   (f) circuit means connected to the high impedance output sides for providing an output signal when a positive or negative DC component is present in the audio-amplifier output having a magnitude above a predetermined level established by the bias voltage sources.

2. A circuit as defined in claim 1, wherein the bias voltage sources are connected to the differential amplifier inputs on the high impedance sides of the current mirror circuits.

3. A circuit as defined in claim 2, wherein the output signal means comprises an OR circuit.

4. A circuit as defined in claim 3, wherein the OR circuit comprises a pair of transistors whose emitters and collectors are connected in common and whose bases and emitters are individually connected in parallel between the emitter and collector of a transistor in each of the current mirror circuits.

5. A circuit as defined in claim 3, wherein the circuit means output is applied to switching means for disconnecting the audio amplifier output from a load, such as a loudspeaker, to thereby implement a protective function.

6. A circuit as defined in claim 1, wherein the output signal means comprises an OR circuit.

7. A circuit as defined in claim 1, wherein the circuit means output is applied to switching means for disconnecting the audio amplifier output from a load, such as a loudspeaker, to thereby implement a protective function.

* * * * *